(12) United States Patent
Kawashima

(10) Patent No.: US 6,791,243 B2
(45) Date of Patent: Sep. 14, 2004

(54) QUARTZ CRYSTAL UNIT AND ITS MANUFACTURING METHOD

(75) Inventor: Hirofumi Kawashima, Tokyo (JP)

(73) Assignee: Piedek Technical Laboratory, Tokyo (JP)

( * ) Notice: Subject to any disclaimer, the term of this patent is extended or adjusted under 35 U.S.C. 154(b) by 0 days.

(21) Appl. No.: 10/320,099

(22) Filed: Dec. 16, 2002

(65) Prior Publication Data

US 2003/0168947 A1 Sep. 11, 2003

(30) Foreign Application Priority Data

Mar. 6, 2002 (JP) ........................................ 2002-060827

(51) Int. Cl.$^7$ .............................................. H01L 41/08
(52) U.S. Cl. ....................... 310/370; 310/348; 310/319; 310/321; 310/361; 310/367
(58) Field of Search ................................ 310/370, 348, 310/361, 367, 321, 319

(56) References Cited

U.S. PATENT DOCUMENTS

| | | | | |
|---|---|---|---|---|
| 4,384,232 A | * | 5/1983 | Debely ........................ | 310/370 |
| 4,592,663 A | * | 6/1986 | EerNisse et al. ............ | 374/117 |
| 5,824,900 A | * | 10/1998 | Konno et al. ............ | 73/504.16 |
| 6,587,009 B2 | * | 7/2003 | Kitamura et al. ........... | 331/158 |
| 6,606,007 B1 | * | 8/2003 | Washburn ................ | 331/116 R |
| 2002/0113527 A1 | * | 8/2002 | Kawashima ................ | 310/370 |
| 2002/0121175 A1 | * | 9/2002 | Kitamura et al. ............. | 84/402 |
| 2002/0121941 A1 | * | 9/2002 | Sakata et al. ................ | 331/154 |
| 2002/0125794 A1 | * | 9/2002 | Tanaya et al. ......... | 310/323.06 |
| 2002/0166379 A1 | * | 11/2002 | Paros et al. .............. | 73/504.12 |
| 2003/0029239 A1 | * | 2/2003 | Hatanaka et al. ......... | 73/504.16 |
| 2003/0056590 A1 | * | 3/2003 | Yanagisawa et al. ..... | 73/504.16 |

FOREIGN PATENT DOCUMENTS

| | | | | | |
|---|---|---|---|---|---|
| JP | 55052623 A | * | 4/1980 | ............ | H03H/9/13 |
| JP | 56065517 | | 6/1981 | ............ | H01L/41/04 |
| JP | 00044092 | | 7/2000 | | |
| JP | 00223992 | | 8/2000 | | |

* cited by examiner

Primary Examiner—Thomas M. Dougherty
Assistant Examiner—J. Aguirrechea
(74) Attorney, Agent, or Firm—Adams & Wilks

(57) ABSTRACT

A quartz crystal unit has a quartz crystal tuning fork resonator capable of vibrating in a flexural mode, a case for housing the quartz crystal tuning fork resonator, and a lid for covering an open end of the case. The quartz crystal tuning fork resonator has a tuning fork base, a pair of tuning fork tines connected to the tuning fork base, a series of grooves each formed on opposite main surfaces of each of the tuning fork tines, and a series of electrodes each disposed in a respective one of the grooves. When W and $W_2$ represent a width of each tuning fork tine and a width of at least one of the grooves formed in the tuning fork tines, respectively, $W_2$ is within a range of 0.03 mm to 0.12 mm, and a ratio ($W_2/W$) is greater than 0.35 and less than 1.

24 Claims, 15 Drawing Sheets

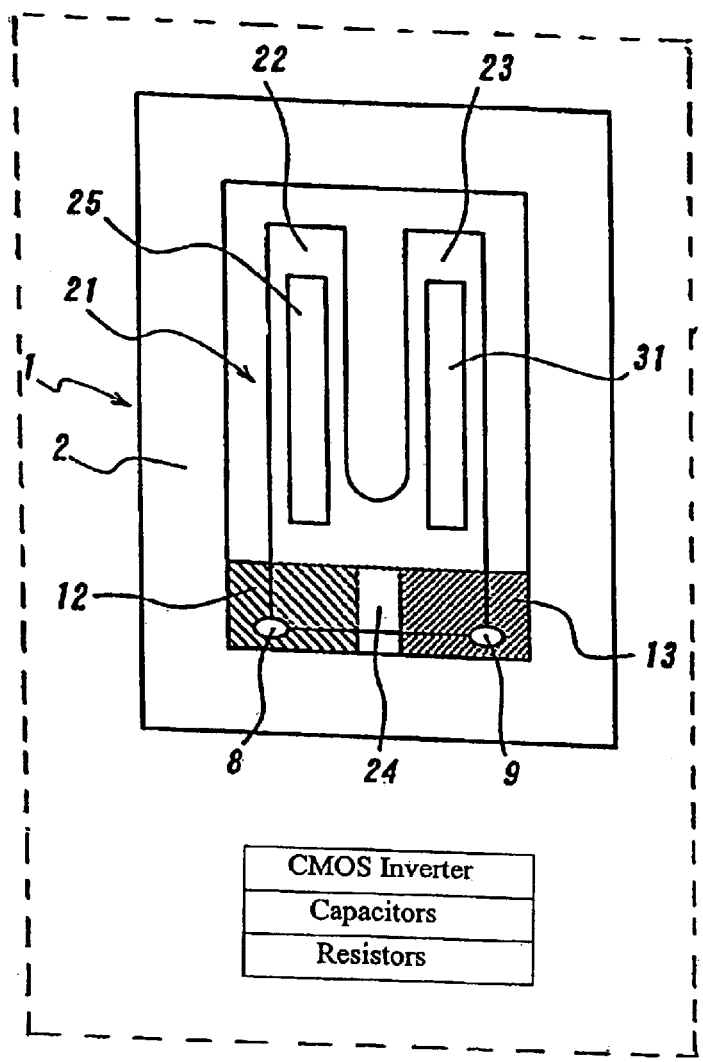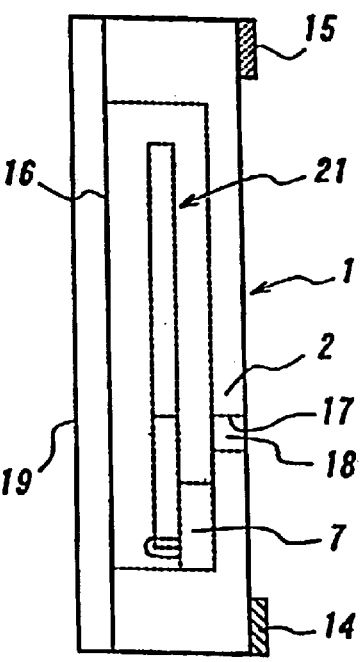
FIG. 1a
FIG. 1b

QUARTZ CRYSTAL UNIT AND ITS MANUFACTURING METHOD

BACKGROUND OF THE INVENTION

Field of the Invention

The present invention relates to a quartz crystal unit comprising a quartz crystal tuning fork resonator capable of vibrating in a flexural mode, a case and a lid, and to a method of manufacturing the quartz crystal unit.

BACKGROUND OF THE INVENTION

Quartz crystal units with a tuning fork, quartz crystal resonator which vibrates in flexural mode are widely used as a time standard in consumer products, wearable equipment and communication equipment (such as wristwatches, cellular phones, and pagers). Recently, because of miniaturization and the light weight nature of these products, a smaller quartz crystal unit with a smaller flexural mode, tuning fork, quartz crystal resonator is required with a small series resistance, a high quality factor and a high frequency stability.

FIG. 15(a) and FIG. 15(b) show a plan view and a side view of a quartz crystal unit 101 with the conventional flexural mode, tuning fork, quartz crystal resonator 100. The resonator 100 comprises tuning fork tines 102, 103 and tuning fork base 104. The base 104 is mounted at a mounting portion 106 of a case 105 by adhesives 107, 108 or solder. Also, electrodes 109 and 110 are disposed on the mounting portion 106 and two electrode terminals are constructed. In addition, the case 105 and the lid 111 are connected via a metal 112. The conventional quartz crystal unit is constructed like this, and it is also needed to obtain a miniature tuning fork, quartz crystal resonator with a high frequency stability to obtain a miniature quartz crystal unit with a high time accuracy.

It is, however, impossible to obtain a miniature quartz crystal unit with a conventional miniaturized, flexural mode, tuning fork, quartz crystal resonator with a small series resistance, a high quality factor and a high frequency stability. When miniaturizing the conventional flexural mode, tuning fork, quartz crystal, resonator shown in FIG. 16 (which has electrodes on the obverse faces 203, 207, reverse faces 204, 208 and the four sides 205, 206, 209, 210 of each tuning fork tine, as also shown in FIG. 17—a cross-sectional view of tuning fork tines of FIG. 16), it has a smaller electromechanical transformation efficiency because the resonator shape and the electrode construction provide a small electric field (i.e. Ex becomes small), as a result of which the resonator has a large series resistance, a reduced quality factor and a low frequency stability. In FIG. 16, the conventional tuning fork resonator 100 is shown with tuning fork tines 102, 103 and tuning fork base 104.

Moreover, for example, Japanese Patent Nos. P56-65517 and P2000-223992A and International Patent No. WO 00/44092 teach grooves and electrodes constructed at tuning fork tines of a flexural mode, tuning fork, quartz crystal resonator. However, they teach nothing about a quartz crystal unit of the present invention having novel shape, novel electrode construction and figure of merit M for a flexural mode, tuning fork, quartz crystal resonator, and also, teach nothing about a method for manufacturing the quartz crystal unit of the present invention.

It is, therefore, an object of embodiments of the present invention to provide a quartz crystal unit with a resonator which overcomes the above problems.

SUMMARY OF THE INVENTION

The present invention relate to the shape and electrode construction of a flexural mode, tuning fork, quartz crystal resonator which is housed in a case, and in particular, a novel shape and electrode construction for a flexural mode, tuning fork, quartz crystal resonator available for consumer products and communication equipment requiring miniaturized, high accuracy, shock proof and low priced quartz crystal units.

It is an object of the present invention to provide a quartz crystal unit with a miniature flexural mode, tuning fork, quartz crystal resonator with a small series resistance $R_1$ and a high quality factor Q.

It is an another object of the present invention to provide a quartz crystal unit with a flexural mode, tuning fork, quartz crystal resonator which is capable of vibrating in a fundamental mode vibration with a high frequency stability which gives a high time accuracy.

It is a further object of the present invention to provide a method for manufacturing a quartz crystal unit.

According to one aspect of the present invention, there is provided a quartz crystal unit with a tuning fork, quartz crystal resonator capable of vibrating in flexural mode comprising; tuning fork tines, and a tuning fork base, at least one groove provided in the central line portion of each of said tuning fork tines, at least one first electrode provided inside each groove, at least one second electrode provided on the sides of said tuning fork tines, and for each tine said at least one second electrode having an opposite electrical polarity to said at least one first electrode.

According to a second aspect of the present invention there is provided a quartz crystal unit with a tuning fork, quartz crystal resonator capable of vibrating in flexural mode comprising; tuning fork tines, and a tuning fork base, a plurality of step difference portions provided at said tuning fork tines along the direction of length thereof, at least two of the plurality of step difference portions being connected via at least one step portion, first electrodes on the step difference portions, second electrodes disposed opposite to the first electrodes on the sides of said tuning fork tines, and said first and second electrodes being of opposite electrical polarity.

According to a third aspect of the present invention there is provided a method for manufacturing a quartz crystal unit comprising; a flexural mode, tuning fork, quartz crystal resonator, a case and a lid.

Embodiments of the present invention may provide a high electromechanical transformation efficiency.

Embodiments of the present invention use grooves or step differences and an electrode construction arranged on the tuning fork tines and/or tuning fork base of a flexural mode, tuning fork, quartz crystal resonator.

Preferably, the resonator has grooves including the central line of the central portions for each tuning fork tine and the electrodes disposed inside the grooves and disposed on the sides of each tuning fork tine. Alternatively or additionally the grooves may be arranged on the tuning fork base and the electrodes disposed inside the grooves.

Preferably, the resonator has a step difference constructed at tuning fork tines and/or tuning fork base and electrodes disposed on the step difference portions.

For a better understanding of the present invention, and as to how the same may be carried into effect, reference will now be made by way of example to the accompanying drawings.

BRIEF DESCRIPTION OF THE DRAWINGS

FIG. 1(a) and FIG. 1(b) show a plan view omitting a lid and a side view of a quartz crystal unit of the first embodiment of the present invention;

DETAILED DESCRIPTION OF THE PREFERRED EMBODIMENTS

Figure 2:
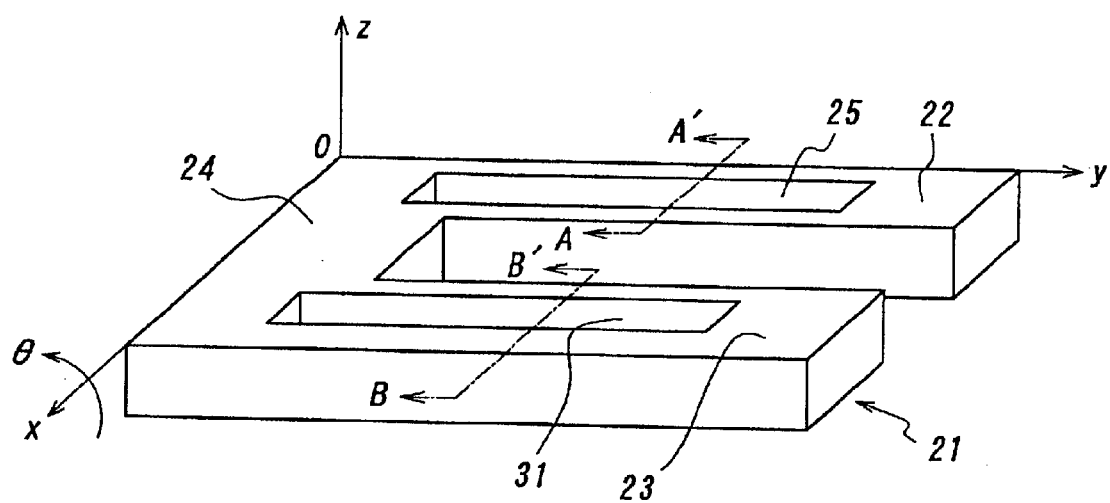
FIG. 2 is a general view of a flexural mode quartz crystal resonator of tuning fork type with grooves at each tuning fork tine constructing the quartz crystal unit of the present invention shown in FIG. 1(a) and FIG. 1(b) and its coordinate system.

Referring now to the drawings, the embodiments of the present invention will be described in more detail.

FIG. 1(a) and FIG. 1(b) show a plan view omitting a lid and a side view of a quartz crystal unit of the first embodiment of the present invention. The quartz crystal unit 1 comprises a case 2, a flexural mode, tuning fork, quartz crystal resonator 21 and a lid 19. Also, the resonator 21 comprises tuning fork tines 22, 23 and tuning fork base 24, and the base 24 is mounted on a mounting portion 7 constructed at the case 2 by conductive adhesives 8, 9 or solder. Additionally, grooves 25, 31 are constructed at the tines 22, 23 and the grooves extends into the base 24 in this embodiment. Flexural mode, tuning fork, quartz crystal resonators which are housed in a case of a quartz crystal unit of the present invention will be described in FIG. 2—FIG. 13 in detail.

Also, electrodes 12, 13 are disposed on the mounting portion 7 and connected to the respective electrodes with opposite electrical polarity disposed on the base 6, as a result of which two electrode terminals are constructed. In full detail, the electrode 12 extends into the reverse face of the case 2 and are connected to an electrode 14 constructed at one end portion thereof, while the electrode 13 also extends into the reverse face of the case 2 and connected to an electrode 15 constructed at other end portion thereof. The case 2 and lid 19 are connected via a connecting member 16.

In this embodiment, though the electrodes 14 and 15 are constructed at both ends of the reverse face of the case 2, they may be constructed at an arbitrary location thereof. This electrode construction is also applied to embodiments which are described as follows.

In addition, the case 2 in this embodiment has a hole 17 to close it in vacuum and the hole 17 is closed by a closing member 18. Also, ceramics or glass as a material of the case, glass or metal as a material of the lid, glass with the low melting point or metal including solder as a connecting member to connect the case and the lid and similarly, the glass with the low melting point or the metal as a closing member to close the hole are used, respectively.

In this embodiment, though the case 2 has the hole 17 to close it in vacuum, the case 2 with no hole and the lid may be directly closed in vacuum via the connecting member. The construction of the case and the lid in this embodiment can be also applied to that of another embodiments which are described as follows.

Figure 3:
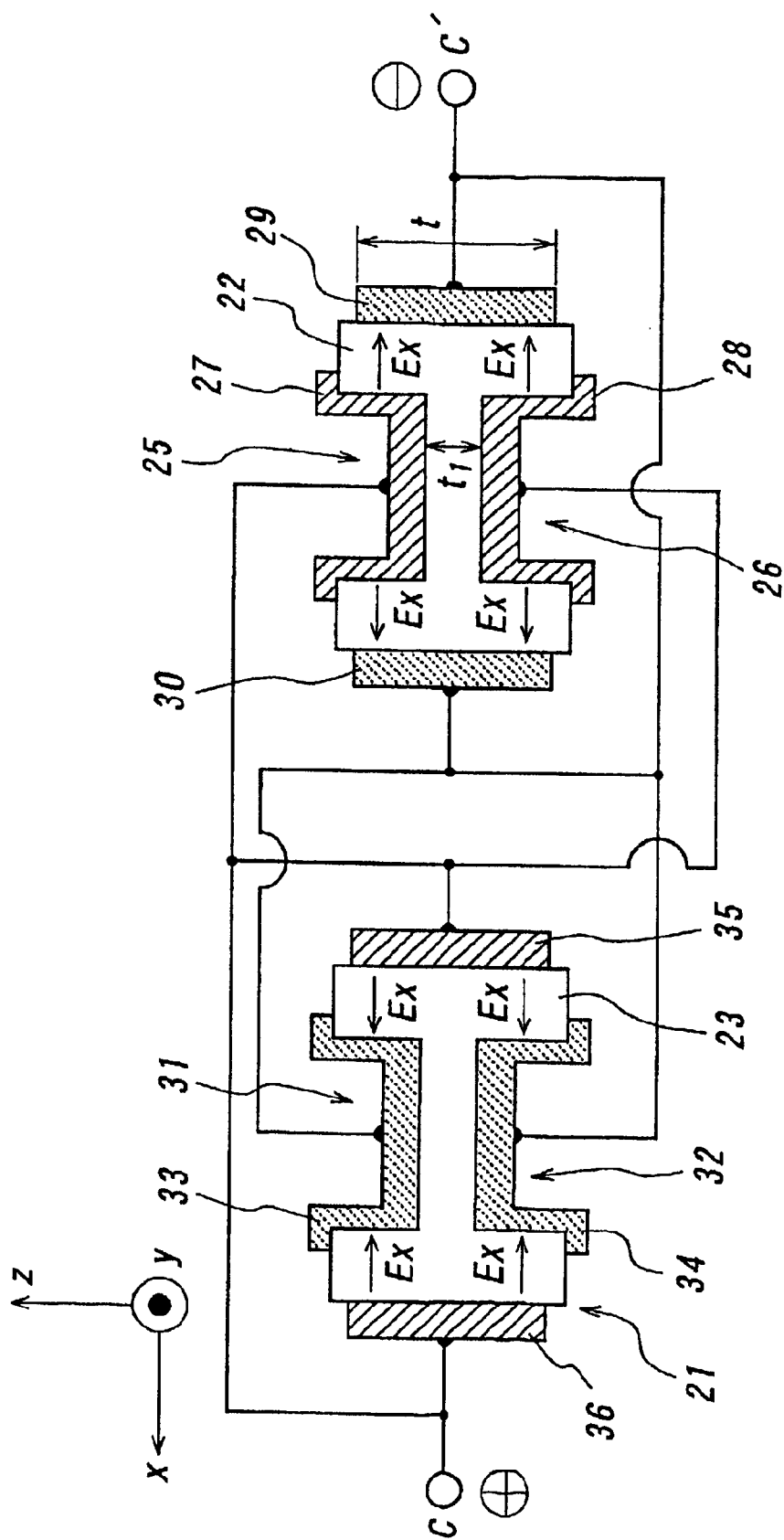
FIG. 3 is a A–A' and B–B' cross-sectional views of the tuning fork tines of FIG. 2 illustrating electrode construction.

FIG. 2 shows a general view of the flexural mode, tuning fork, quartz crystal resonator 21 which is housed in the case 2 of FIGS. 1(a), 1(b) embodying the present invention and its coordinate system. The coordinate system consists of an origin o, an electrical axis x, a mechanical axis y and an optical axis z of quartz, namely, o-xyz. The flexural mode, tuning fork, quartz crystal resonator 21 comprises a first tuning fork tine 22, a second tuning fork tine 23 and a tuning fork base 24, the first tuning fork tine 22 and the second tuning fork tine 23 are connected at the tuning fork base 24. In addition, grooves 25 and 31 are constructed within the obverse face of tuning fork tines 22 and 23 which include a portion of the central line, respectively, as shown in FIG. 3, the same grooves are constructed within the reverse face of the tines 22 and 23. A cut angle θ, which has a typical value of 0° to 10°, is rotated from a Z-plate perpendicular to z axis about the x axis. Additionally, a groove is constructed with at least two step difference portions along the direction of length of the tuning fork tines whose step difference portions face each other. In this embodiment, the groove is constructed with four step difference portions and has a rectangular shape in the plan view of FIG. 1.

FIG. 3 shows the A–A' and B–B' cross-sectional views of the tuning fork tines of FIG. 2 and electrode construction within the grooves. The A–A' cross-sectional view of the tine 22 is shown on the right side and the B–B' cross-sectional view of the tine 23 on the left side. The tine 22 has grooves 25 and 26 cut into it, which include a portion of central line of the tine 22. The grooves 25 and 26 have a first set of electrodes 27 and 28 of the same electrical polarity, while the sides of the tine 22 have a second set of electrodes 29 and 30 having an opposite electrical polarity to the first set of electrodes 27 and 28. The tine 23 has grooves 31 and 32 constructed in a similar manner as the tine 22. The grooves 31 and 32 have a third set of electrodes 33 and 34 of the same electrical polarity, and the sides of the tine 23 have a fourth set of electrodes 35 and 36 with the opposite electrical polarity to the third electrodes 33 and 34. The electrodes disposed on the tines 22 and 23 are connected as shown in FIG. 3, namely, two electrode terminals of opposite electrical polarity C–C' are obtained.

In detail, the first set of electrodes 27 and 28 disposed on the grooves 25 and 26 of the tine 22 have the same electrical polarity as the fourth set of electrodes 35 and 36 disposed on both sides of the tine 23, while the second set of electrodes 29 and 30 disposed on both sides of the tine 22 have the same electrical polarity as the third set of electrodes 33 and 34 disposed on the grooves 31 and 32 of the tine 23. In addition, the tuning fork tines have a dimension of a tine thickness t and a groove thickness $t_1$. Now, when a direct voltage is applied between the electrode terminals C–C', an electric field Ex occurs along the arrow direction inside the tines 22 and 23. As the electric field Ex occurs perpendicular to the electrodes disposed on the tuning fork tines, as shown in the arrow signs, the electric field Ex has a very large value and a large distortion occurs at the tuning fork tines. As a result, a flexural mode, tuning fork, quartz crystal resonator is obtained with a small series resistance $R_1$ and a high quality factor Q because even when miniaturized there is a large electromechanical transformation efficiency for the resonator.

Figure 4:
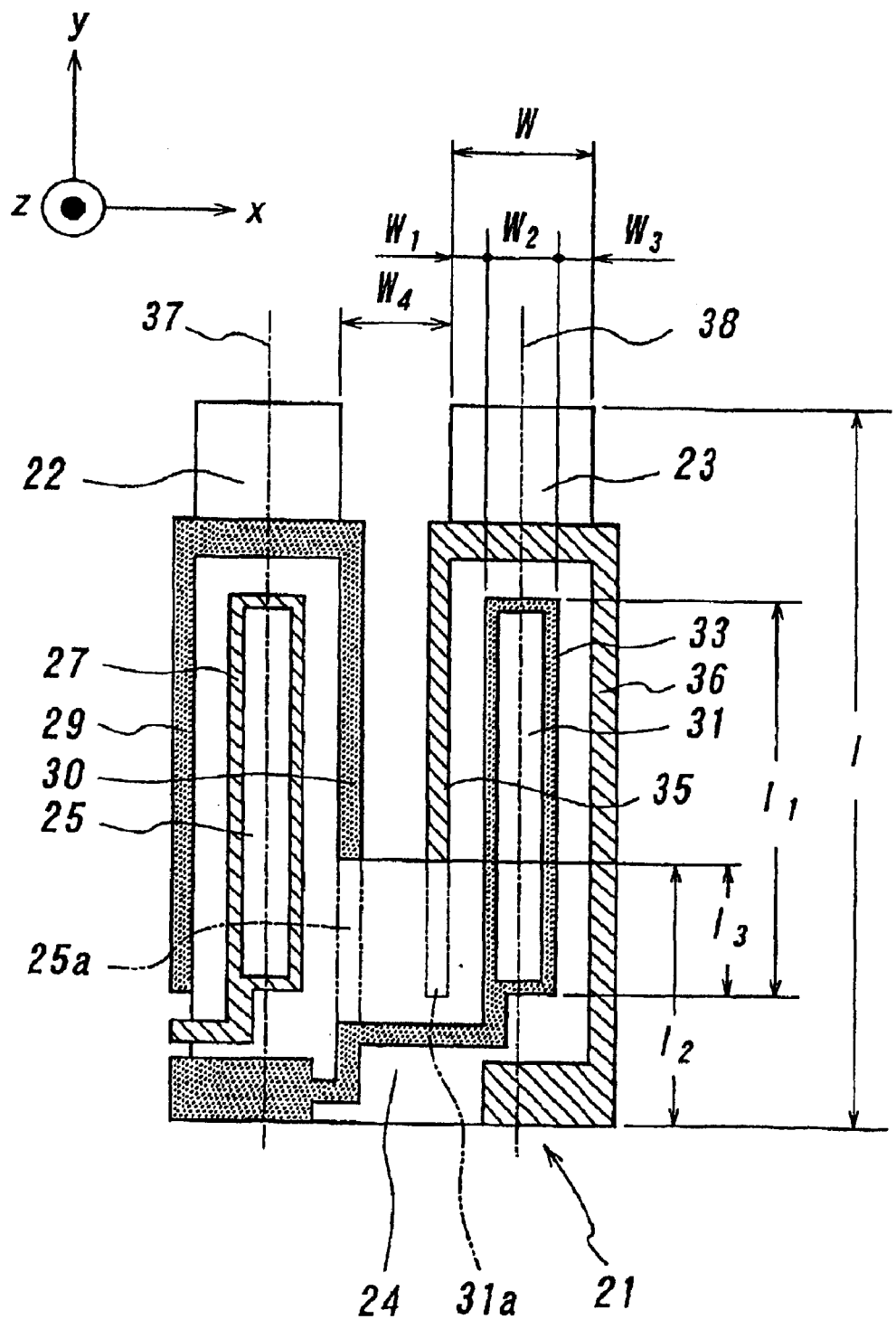
FIG. 4 is a plan view of the tuning fork, quartz crystal resonator of FIG. 2, and illustrating electrode construction.

FIG. 4 shows a plan view of a tuning fork, quartz crystal resonator 21 of FIG. 2. In FIG. 4, the construction and the dimension of grooves 25 and 31 are described in detail. The groove 25 is constructed to include a portion of the central line 37 of the tine 22, the groove 31 is similarly constructed to include a portion of the central line 38 of the tine 23. The width $W_2$ of the grooves 25 and 31 (groove width $W_2$) which include a portion of the central lines 37 and 38 respectively, is preferable because moment of inertia of the tines 22 and 23 becomes large and the tines can vibrate in a flexural mode very easily. As a result of which the flexural mode, tuning fork, quartz crystal resonator capable of vibrating in fundamental mode can be obtained with a small series resistance $R_1$ and a high quality factor Q.

In more detail, when part widths $W_1$, $W_3$ and groove width $W_2$ are taken, the tine width W of the tines 22 and 23 has a relationship of $W=W_1+W_2+W_3$, and a part or all of at least one of the grooves are constructed so that $W_1 \geq W_3$ or $W_1 < W_3$. In addition, the groove width $W_2$ is constructed so that $W_2 \geq W_1, W_3$. In this embodiment, also, the grooves are constructed at the tuning fork tines so that a ratio($W_2$/W) of the groove width $W_2$ and the tine width W is larger than 0.35 and less than 1, and a ratio($t_1$/t) of the groove thickness $t_1$ and the thickness t of the tuning fork tines(tine thickness t) is less than 0.79, preferably, within a range of 0.01 to 0.79 to obtain very large moment of inertia of the tuning fork tines. That is to say, the flexural mode, tuning fork, quartz crystal resonator capable of vibrating in fundamental mode can be provided with a small series resistance $R_1$, a high quality factor Q and a small capacitance ratio because electromechanical transformation efficiency becomes large markedly.

Likewise, length $l_1$ of the grooves 25 and 31 of the tines 22 and 23 extends into the base 24 in this embodiment (which has a dimension of the length $l_2$ and the length $l_3$ of the grooves). Therefore, groove length and length of the tuning fork tines are given by ($l_1-l_3$) and ($l-l_2$), respectively, and a ratio of ($l_1-l_3$) and ($l-l_2$) is within a range of 0.4 to 0.8 to get a flexural mode, tuning fork, quartz crystal resonator with small series resistance $R_1$.

Furthermore, the total length l is determined by the frequency requirement and the size of the housing case. At the same time, to get a flexural mode, tuning fork, quartz crystal resonator capable of vibrating easily in fundamental mode with suppression of the second and third overtone modes which are unwanted vibration modes, there is a close relationship between the groove length $l_1$ and the total length l. Namely, a ratio($l_1$/l) of the groove length $l_1$ and the total length l is within a range of 0.2 to 0.78 because the quantity of charges which generate within the grooves and on the sides of the tuning fork tines or the tuning fork tines and the tuning fork base can be controlled by the ratio, as a result of which the second and third overtone modes which are unwanted vibration modes can be suppressed substantially, and simultaneously, a frequency stability of fundamental mode vibration can be increased. Therefore, a flexural mode, tuning fork, quartz crystal resonator capable of vibrating in fundamental mode easily can be realized with the high frequency stability.

More specifically, series resistance $R_1$ of the quartz crystal resonator capable of vibrating in fundamental mode becomes smaller than series resistances $R_2$ and $R_3$ of the second and third overtone modes. Namely, $R_1 < R_2$, $R_3$, preferably, $R_1 < 0.86 R_n$, where $R_n$ is series resistance of overtone mode vibration. Therefore, as shown by the broken line in FIG. 1a, an oscillator (oscillator circuit) comprising an amplifier (CMOS inverter), capacitors, resistors (resistance elements) and a quartz crystal unit with the tuning fork quartz crystal resonator of this embodiment, which is capable of vibrating in fundamental mode very easily is obtained. In addition, in this embodiment the grooves 25 and 31 of the tines 22 and 23 extend into the base 24 in series, but another embodiment of the present invention includes a plurality of grooves divided into the length direction of the tuning fork tines. In addition, the grooves may be constructed only at the tuning fork tines ($l_3=0$)

In this embodiment, the groove length $l_1$ corresponds to electrode length disposed inside the grooves as shown in FIG. 4, but, when the electrode length is less than the groove length, the length $l_1$ is of the electrode length. Namely, the ratio($l_1$/l) in this case is expressed by a ratio of electrode length $l_1$ of the grooves and the total length l. In order to achieve the above-mentioned object, it may be satisfied with at least one groove with the ratio constructed at the obverse and reverse faces of each tuning fork tine. As a result of which the flexural mode, tuning fork, quartz crystal resonator capable of vibrating very easily in fundamental mode can be realized. Also, a fork portion of this embodiment has a rectangular shape, but this invention is not limited to this, for example, the fork portion may have a U shape.

In addition, a space of between the tuning fork tines is given by $W_4$, and in this embodiment, the space $W_4$ and the groove width $W_2$ are constructed so that $W_4 \geq W_2$, and more, the space $W_4$ is within a range of 0.05 mm to 0.35 mm and the width $W_2$ is within a range of 0.03 mm to 0.12 mm because it is easy to form a tuning fork shape and grooves of the tuning fork tines separately by a photo-lithographic process and an etching process, as a result of which a frequency stability for a fundamental mode vibration gets higher than that for overtone mode vibrations. In this embodiment, a quartz crystal wafer with the thickness t of 0.05 mm to 0.12 mm is used. But, it is possible to use the wafer thicker than 0.12 mm.

In more detail, to obtain a flexural mode, tuning fork, quartz crystal resonator with a high frequency stability which gives high time accuracy, it is necessary to obtain the resonator whose resonance frequency is not influenced by shunt capacitance because quartz crystal is a piezoelectric material and the frequency stability is very dependent on the shunt capacitance. In order to decrease the influence on the resonance frequency by the shunt capacitance, a merit value or figure of merit $M_i$ plays an important role. Namely, the figure of merit $M_i$ that expresses inductive characteristics, electromechanical transformation efficiency and a quality factor of a flexural mode, tuning fork, quartz crystal resonator, is defined by a ratio($Q_i/r_i$) of a quality factor $Q_i$ and capacitance ration $r_i$, where i=1, 2 and 3 are for fundamental, second overtone and third overtone mode vibrations, respectively.

Also, a frequency difference $\Delta f$ of resonance frequency $f_s$ of mechanical series independent on the shunt capacitance and resonance frequency $f_r$ dependent on the shunt capacitance is inversely proportional to the figure of merit $M_i$. The larger the value $M_i$ becomes, the smaller the difference $\Delta f$ becomes. Namely, the influence on the resonance frequency $f_r$ by the shunt capacitance decreases because it is close to the resonance frequency $f_s$. Accordingly, the larger the $M_i$ becomes, the higher the frequency stability of the flexural mode, tuning fork, quartz crystal resonator becomes because the resonance frequency $f_r$ of the resonator is almost never dependent on the shunt capacitance.

In detail, a tuning fork quartz crystal resonator capable of vibrating in flexural mode can be obtained with figure of merit $M_1$ of fundamental mode vibration larger than figures of merit $M_2$, $M_3$ of second and third overtone mode vibrations by the above-described tuning fork shape, grooves and dimensions.

As an example, when resonance frequency of the tuning fork quartz crystal resonator is about 32.768 kHz for a fundamental mode vibration and the resonator has a value of $W_2/W=0.5$, $t_1/t=0.34$ and $l_1/l=0.48$, though there is a distribution in production, the tuning fork quartz crystal resonator has a value of $M_1>65$, $M_2<30$ and $M_3<18$, respectively. Namely, the flexural mode, tuning fork, quartz crystal resonator which is capable of vibrating in fundamental mode can be provided with high inductive characteristics, excellent electromechanical transformation efficiency and a high quality factor. As a result of which frequency stability of the fundamental mode vibration becomes higher than that of the second and third overtone mode vibrations, and at the same time, the second and third overtone mode vibrations can be suppressed. Therefore, the resonator capable of vibrating in the fundamental mode vibration can be provided with a high time accuracy because it has the high frequency stability. Also, a nominal frequency of fundamental mode vibration of the present invention is less than 200 kHz, preferably, within a range of 10 kHz to 200 kHz.

By constructing the space $W_4$ of between tuning fork tines and groove width $W_2$ as described above, it is easy to form the tuning fork tines and grooves which are provided at the tuning fork tines separately, namely, by a separate step. However, in order to form the tuning fork tines and the grooves simultaneously, it is necessary to obtain an optimum dimension of tine thickness t, groove width $W_2$, space $W_4$ of the tines and groove area $S(=l_1 \times W_2)$. For example, when the tine thickness t is within a range of 0.06 mm to 0.15 mm, the groove width $W_2$, the groove area S and the space $W_4$ are constructed so that they are within a range of 0.02 mm to 0.08 mm, 0.023 mm² to 0.098 mm² and 0.05 mm to 0.35 mm, respectively. This is the reason why crystalline characteristics of quartz crystal and/or a groove shape are used and from the crystalline characteristics and/or the groove shape the grooves(which are not through holes) and the tuning fork tines are formed simultaneously, namely, by a simultaneous step using a photolithographic process and an etching process. As an example of the groove shape, groove width $W_2$ is not constant along the length direction of tuning fork tines or grooves are divided into the length direction thereof.

Figure 5:
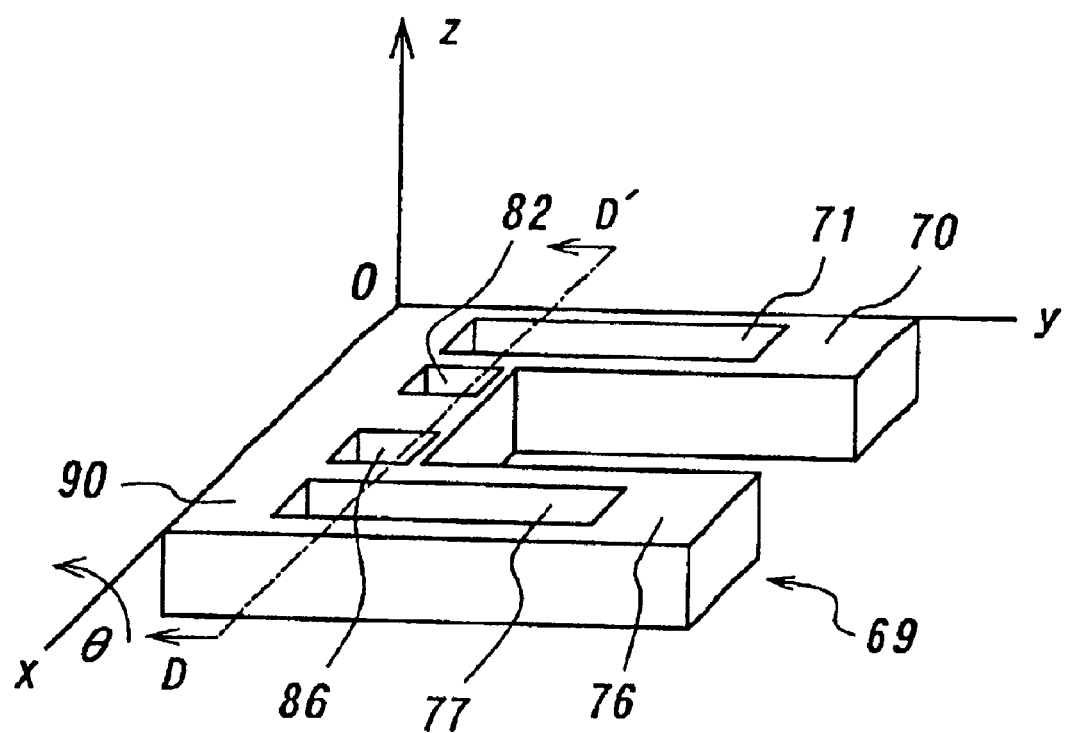
FIG. 5 is a general view of a flexural mode, tuning fork, quartz crystal resonator constructing a quartz crystal unit of the second embodiment of the present invention, and having plural grooves at the tuning fork base.

In addition, groove length $l_1$ of the present invention is length of grooves constructed at tuning fork tines so that the ratio ($t_1/t$) of the groove thickness $t_1$ and the tine thickness t is less than 0.79, and the ratio($W_2/W$) of the groove width $W_2$ and the tine width W is larger than 0.35 and less than 1, when the grooves are constructed only at the tuning fork tines, and also, as will be shown in FIG. 5, when the grooves constructed at the tuning fork tines extend into a tuning fork base and at least one groove is constructed between the grooves extended into the tuning fork base, groove length $l_1$ of the present invention is length of grooves constructed at the tuning fork tines and the tuning fork base(groove length $l_3$). Namely, when the grooves constructed at the tuning fork tines extend into the tuning fork base and at least one groove is not constructed between the grooves extended into the tuning fork base, the groove length $l_1$ of the present invention is length of grooves constructed at the tuning fork tines. Also, when the grooves of the tines are divided into the length direction thereof or connected via at least one step portion, the groove length $l_1$ is total length of the length direction satisfying the ratios ($t_1/t$) and ($W_2/W$) described above. Here, the groove thickness $t_1$ implies the thinnest thickness of the grooves because quartz crystal is an anisotropic material and the groove thickness $t_1$ has a distribution when it is formed by a chemical etching method.

In summary the embodiments shown within FIG. 1 to FIG. 4, the tuning fork tines have four grooves within the obverse and the reverse faces thereof and electrodes provided inside the grooves as well as electrodes disposed on both sides of the tuning fork tines. The embodiments of the present invention, however, may have at least one groove within at least one surface of the tuning fork tines and an electrode inside the at least one groove as well as electrodes disposed on both sides of the tuning fork tine. Also, it is provided that the first electrode inside the groove and the second electrodes on said side of the tine next to said electrode are of opposite electrical polarity.

In addition, though the electrodes are disposed within the grooves and on the sides of the tuning fork base in this embodiment, the present invention is not limited to this, but includes at least one electrode which is of opposite electrical polarity to the electrodes of adjoining grooves between the grooves of the tuning fork base, disposed on each of the obverse and reverse faces thereof. For example, two electrodes 25a and 31a illustrated by virtual lines in FIG. 4, or four electrodes where the electrodes disposed opposite each other in the thickness direction are of the same electrical polarity.

FIG. 5 shows a general view of a flexural mode, tuning fork, quartz crystal resonator 69 which constructs a quartz crystal unit of the second embodiment of the present invention and its coordinate system o-xyz. A cut angle θ, which has a typical value of 0° to 10°, is rotated from a Z-plate perpendicular to the z axis about the x axis. The flexural mode, tuning fork, quartz crystal resonator 69 comprises two tuning fork tines 70 and 76 and tuning fork base 90. The tines 70 and 76 have grooves 71 and 77 respectively, with the grooves 71 and 77 extending into the base 90. In addition, the base 90 has the additional grooves 82 and 86.

Figure 6:
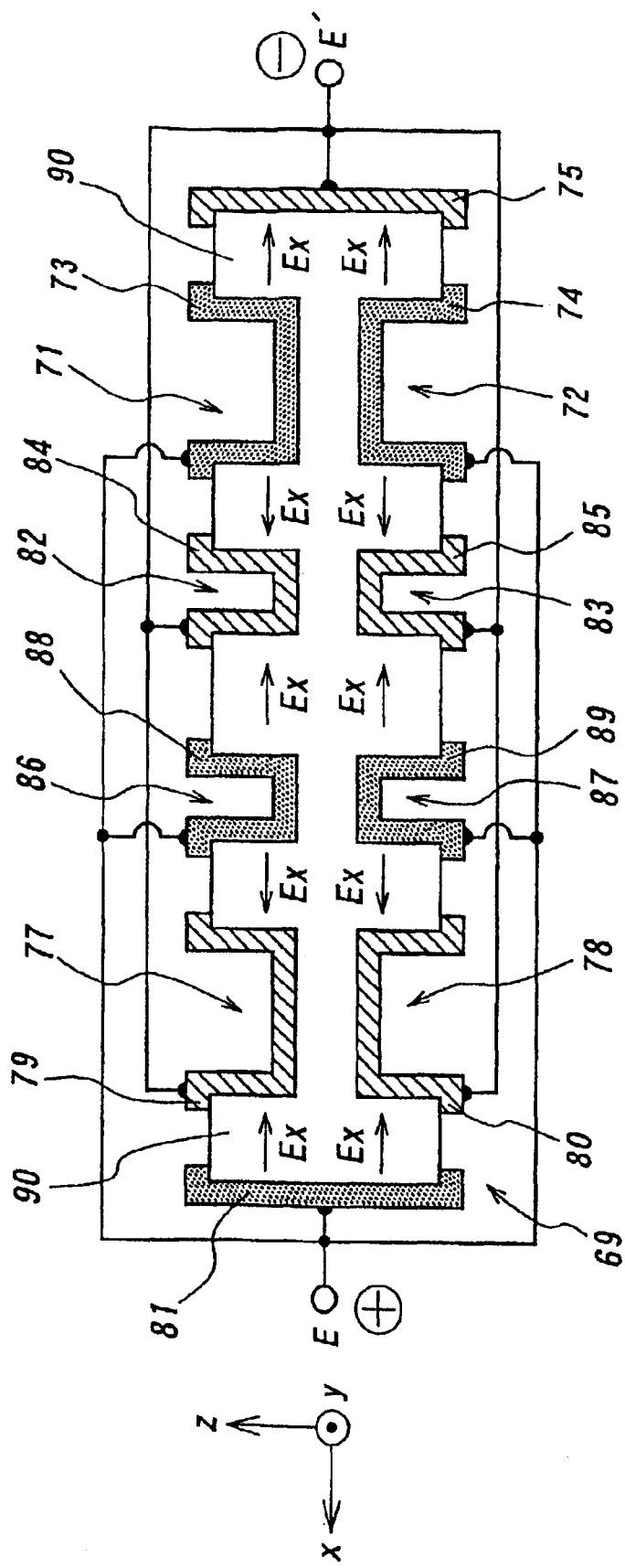
FIG. 6 is a D–D' cross-sectional view of the tuning fork base of FIG. 5, and illustrating electrode construction.

FIG. 6 shows a D–D' cross-sectional view of the tuning fork base 90 for the tuning fork quartz crystal resonator 69 of FIG. 5. In FIG. 6, the shape of the electrode construction within the base 90 for the quartz crystal resonator of FIG. 5 is described in detail. The section of the base 90 which couples to the tine 70 has the grooves 71 and 72 cut into the obverse and the reverse faces of the base 90. Also, the section of the base 90 which couples to the tine 76 has the grooves 77 and 78 cut into the obverse and the reverse faces of the base 90. In addition to these grooves, the base 90 has the grooves 82 and 86 cut between the grooves 71 and 77, and also, the base 90 has the grooves 83 and 87 cut between the grooves 72 and 78.

Furthermore, the grooves 71 and 72 have the first electrodes 73 and 74 both of the same electrical polarity, the grooves 82 and 83 have the second electrodes 84 and 85 both of the same electrical polarity, the grooves 86 and 87 have the third electrodes 88 and 89 both of the same electrical polarity, the grooves 77 and 78 have the fourth electrodes 79 and 80 both of same electrical polarity and the sides of the base 90 have the fifth and sixth electrodes 75 and 81, each of opposite electrical polarity. In more detail, the fifth, fourth, and second electrodes 75, 79, 80, 84 and 85 have the same electrical polarity, while the first, sixth and third electrodes 73, 74, 81, 88 and 89 have the opposite electrical polarity to the others. Two electrode terminals E–E' are constructed. That is, the electrodes disposed inside the grooves constructed opposite each other in the thickness (z axis) direction have the same electrical polarity. Also, the electrodes disposed opposite each other across adjoining grooves have opposite electrical polarity.

Now, when a direct voltage is applied between the electrode terminals E–E' (E terminal: plus, E' terminal: minus), an electric field Ex occurs in the arrow direction as shown in FIG. 6. As the electric field Ex occurs perpendicular to the electrodes disposed on the tuning fork base, the electric field Ex has a very large value and a large distortion occurs at the tuning fork base, so that a flexural mode, tuning fork, quartz crystal resonator is obtained with a small series resistance $R_1$ and a high quality factor Q, even if it is miniaturized.

Figure 7:
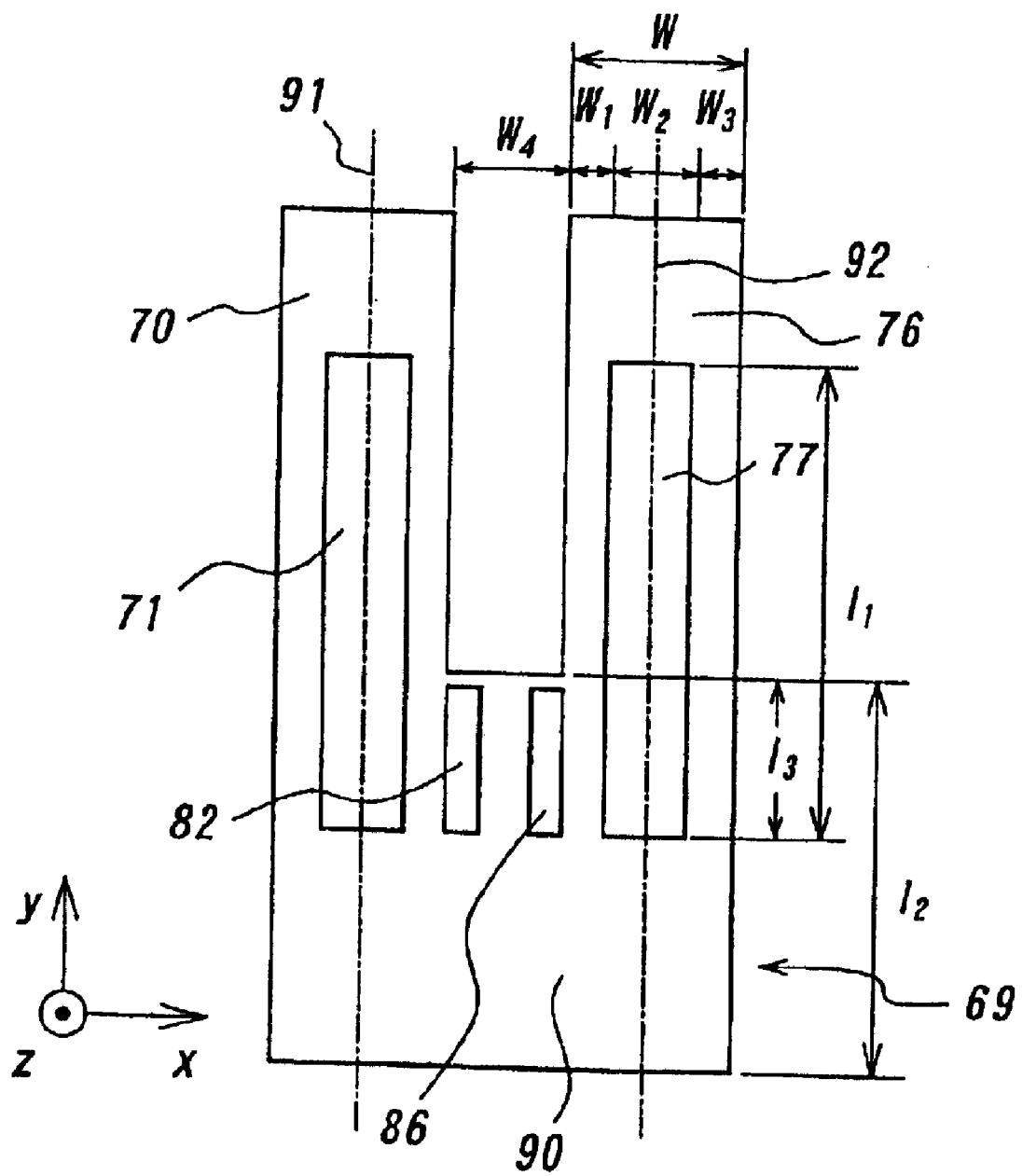
FIG. 7 is a plan view of the flexural mode quartz crystal resonator of FIG. 5.

FIG. 7 shows a plan view of the tuning fork, quartz crystal resonator 69 of FIG. 5. In FIG. 7, the disposition of the grooves 71 and 77 is particularly described in detail. The tine 70 has the groove 71 cut including a portion of the central line 91 of the tine, as well, the tine 76 has also the groove 77 cut including a portion of the central line 92 of the tine. In addition, a flexural mode, tuning fork, quartz crystal resonator embodying the present invention has grooves 82 and 86 between the grooves 71 and 77 constructed at the base 90 and the tines 70 and 76.

Thus, a flexural mode, tuning fork, quartz crystal resonator with the shape and the electrode construction embodying the present invention has excellent electrical characteristics, even if it is miniaturized. Namely, the quartz crystal resonator has a small series resistance $R_1$ and a high quality factor Q. The width dimension $W=W_1+W_2+W_3$, $W_4$ and length dimensions $l_1$, $l_2$, $l_3$ and l(not shown here) are as already described in relation to FIG. 4.

Figure 8:
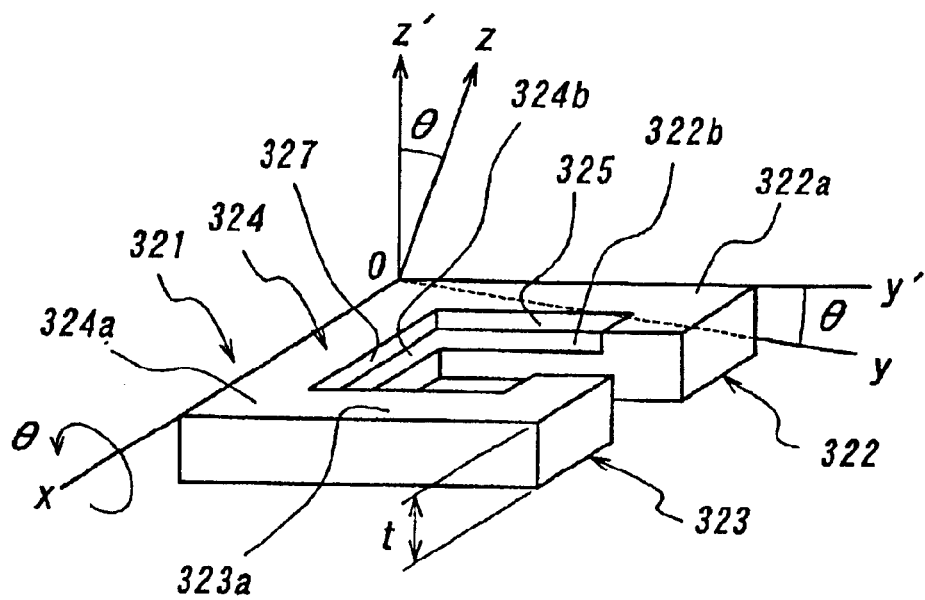
FIG. 8 is a general view of a flexural mode, tuning fork, quartz crystal resonator constructing a quartz crystal unit of the third embodiment of the present invention and its coordinate system.
Figure 9:
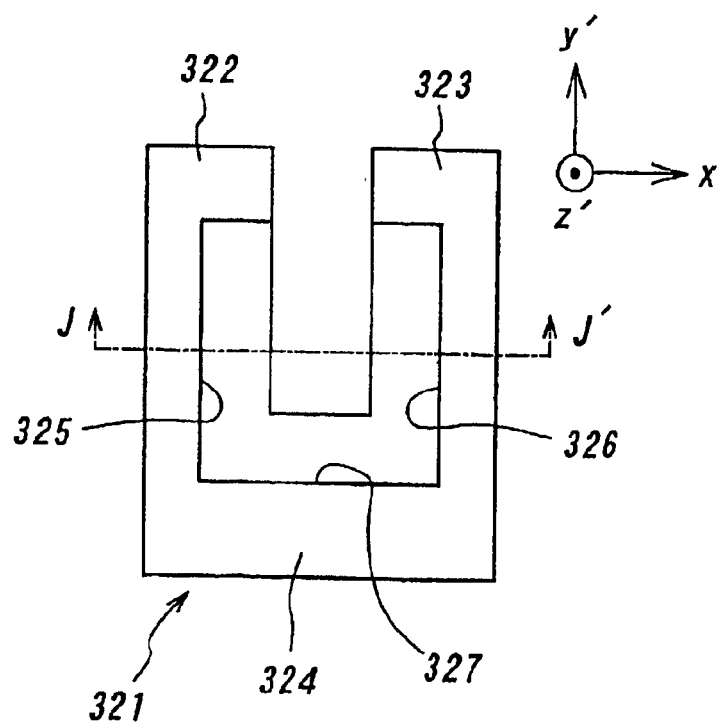
FIG. 9 is a plan view of the flexural mode quartz crystal resonator of FIG. 8.
Figure 10:
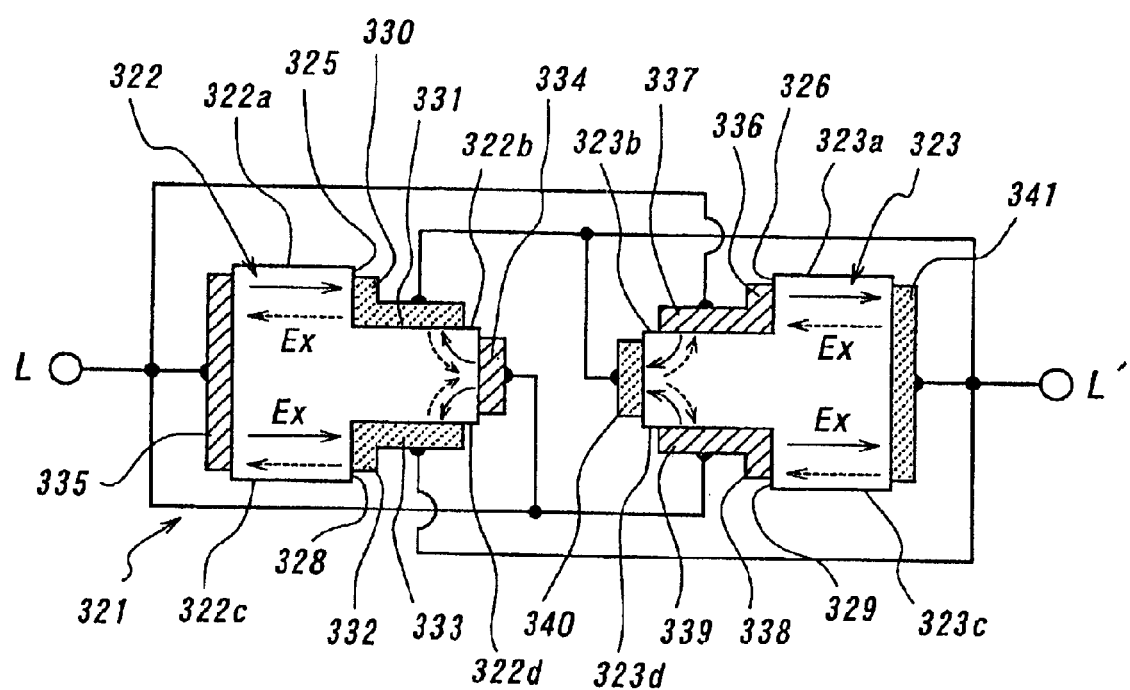
FIG. 10 is a J–J' cross-sectional view of the tuning fork tines of FIG. 9, and illustrating electrode construction.

FIG. 8 shows a general view of a flexural mode, tuning fork, quartz crystal resonator 321 which constructs a quartz crystal unit of the third embodiment of the present invention and its coordinate system. FIG. 9 is a plan view of the resonator 321 of FIG. 8, and FIG. 10 shows a J–J' cross-sectional view of tuning fork tines of FIG. 9. A flexural mode, tuning fork, quartz crystal resonator 321 comprises the tuning fork tines 322, 323 and the tuning fork base 324, and has a thickness t. In addition, the tine 322 has the step difference, as shown in FIG. 8 and FIG. 10. The upper surface portion 322a, the medium surface portions 322b, 322d, the step difference portions 325, 328 and the lower surface portion 322c are formed on the tine 322. The medium surface portions 322b, 322d, and the step difference portions 325, 328 extend to the base 324 whose obverse face is shaped to the upper surface portion 324a, the medium surface portion 324b and the step difference portion 327 and whose reverse face has the same shape as the obverse face (though the shape is not shown in the FIGS. 8 and 9).

Figure 11:
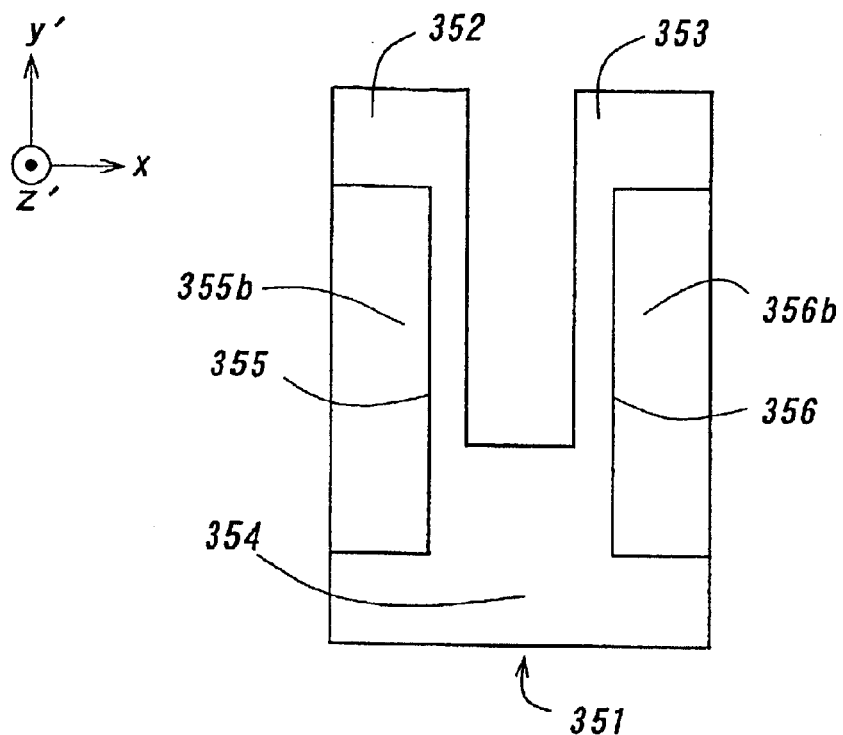
FIG. 11 is a plan view of a flexural mode quartz crystal resonator constructing a quartz crystal unit of the fourth embodiment of the present invention.
Figure 12:
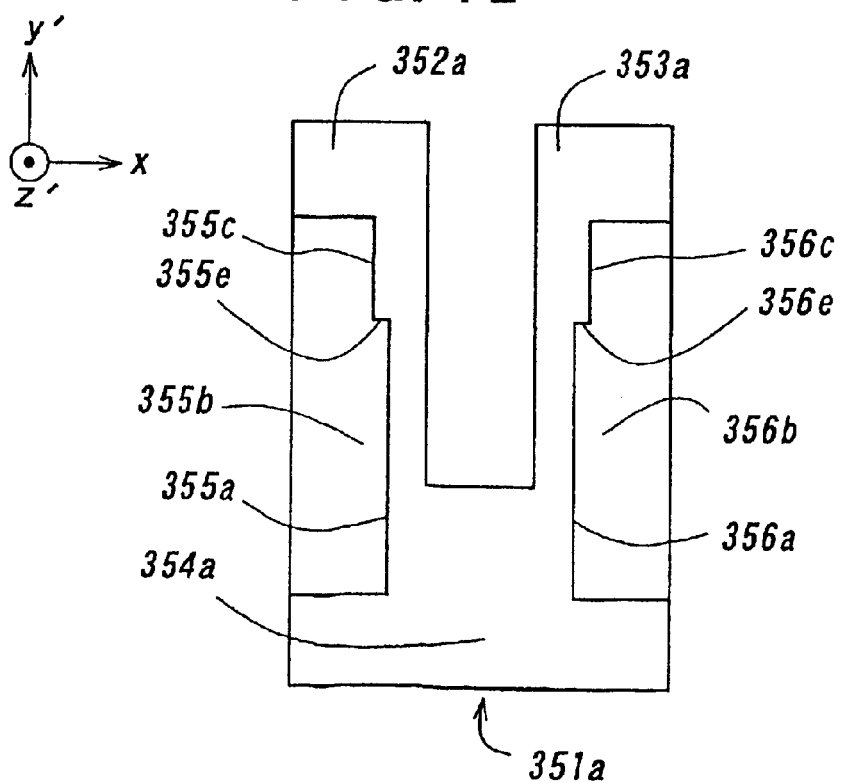
FIG. 12 is a plan view of a flexural mode quartz crystal resonator constructing a quartz crystal unit of the fifth embodiment of the present invention.

In the same way, the upper surface portion 323a, the medium surface portions 323b, 323d, the step difference portions 326, 329 and the lower surface portion 323c are formed on the tine 323. The medium surface portions 323b, 323d and the step difference portions 326, 329 extend to the base 324 in a manner similar to said tine 322. Namely, as shown in FIGS. 9 and 10, the tines 322 and 323 have the step difference portions 325 and 326 which extend to the base 324 and connect at the step difference portion 327. In addition, the step difference portions 325 and 328 are constructed at the obverse and reverse faces of the tine 322 and also the step difference portions 326 and 329 are constructed on the obverse and reverse faces of the tine 323. In this embodiment, the step difference portions 325, 328 and 326, 329 turn to the inside of the tines 322 and 323, the same effect is obtained when said step difference portions 325, 328 and 326, 329 turn to outside of said tines 322 and 323, as shown in FIGS. 11 and 12.

Furthermore, the electrode 330 is disposed on the step difference portion 325 and electrode 331, which is connected to the electrode 330, is disposed on the medium surface portion 322b, electrode 332 is also disposed on the step difference portion 328 and electrode 333, which is connected to the electrode 332, is disposed on the medium surface portion 322d, and electrodes 334, 335 are disposed on both sides of the tine 322. Namely, electrode 335 is disposed opposite electrodes 330 and 332 which are of opposite electrical polarity from said electrode 335. Similar to said tine 322, the tine 323 also has the step difference and electrodes of left and right symmetry to said tine 322.

That is to say, the tine 323 has the step difference portions 326, 329, the upper surface portion 323a, the medium surface portions 323b, 323d and the lower surface portion 323c, and the step difference portion 326 has electrode 336, which is connected to electrode 337, disposed on the medium surface portion 323b, while the step difference portion 329 has electrode 338, which is connected to electrode 339, disposed on the medium surface portion 323d, and electrodes 340, 341 are disposed on both sides of the tine 323. Namely, electrode 341 is disposed in opposition to electrodes 336 and 338 which are of opposite electrical polarity from said electrode 341. In full detail, as shown in FIG. 10, the first set of electrodes 330, 331, 332, 333, 340 and 341 have the same electrical polarity, while the second set of electrodes 334, 335, 336, 337, 338 and 339 are of opposite electrical polarity to the first set of electrodes. Two electrode terminals L–L' can be constructed.

When an alternating current (AC) voltage is applied between the two electrode terminals L–L', an electric field Ex occurs perpendicular to and alternately between the electrodes, as shown by the solid and broken arrow signs in FIG. 10 and a flexural mode vibration may be easily excited, so that a flexural mode, tuning fork, quartz crystal resonator is obtained with a small series resistance $R_1$ and a high quality factor Q because the electromechanical transformation efficiency for the resonator becomes large. In this embodiment, the tines 322 and 323 have the medium surface portions 322b, 322d, 323b and 323d on the inside of the said tines, but, the same effect as that of said shape can be obtained when the medium surface portions are constructed on the outside of the tines 322 and 323, as shown in FIGS. 11 and 12.

FIG. 11 shows a plan view of a flexural mode quartz crystal resonator 351 which constructs a quartz crystal unit of the fourth embodiment of the present invention. The resonator 351 comprises tuning fork tines 352, 353 and tuning fork base 354. The tines 352 and 353 have step difference portions 355, 356 and medium surface portions 355b, 356b respectively. In this embodiment, the step difference portions 355, 356 and the medium surface portions 355b, 356b extend into the base 354. Thus, the step difference portions turn to outside of said tines, and the medium surface portions are constructed on the outside of said tines. In addition, electrode construction of the tines is not shown in FIG. 11, but it is performed similar to that of FIG. 10. This resonator also has the same effect as that of FIG. 8.

FIG. 12 shows a plan view of a flexural mode quartz crystal resonator 351a which constructs a quartz crystal unit of the fifth embodiment of the present invention. The resonator 351a comprises tuning fork tines 352a, 353a and tuning fork base 354a. The tines 352a and 353a have step difference portions 355a, 355c, 356a, 356c along the direction of length thereof and medium surface portions 355b, 356b, respectively. In addition, the step difference portions 355a and 355c are connected via a step portion 355e, and the step difference portions 356a and 356c are connected via a step portion 356e. In this embodiment, the step difference portions 355a, 356a and the medium surface portions 355b, 356b extend into the base 354a. Electrodes for this resonator are not disposed in FIG. 12, but they are disposed on the step difference portions, the medium surface portions and sides of the tuning fork tines similar to that of FIG. 10. Thus, by constructing the electrodes and the step portions, a tuning fork, quartz crystal resonator capable of vibrating in fundamental mode very easily can be obtained with a small series resistance $R_1$ and a high quality factor Q because the quantity of charges which generate on the step difference portions and the sides of the tuning fork tines can be controlled and the second and third overtone modes for the resonator which are unwanted vibration modes can be substantially suppressed.

In this embodiment, each tuning fork tine has two step difference portions on the obverse face along the direction of length thereof which are connected via a step portion, but this invention is not limited to this. That is to say, the present invention also includes a flexural mode, tuning fork, quartz crystal resonator comprising tuning fork tines and a tuning fork base formed integrally, a plurality of step difference portions constructed at said tuning fork tines along the direction of length thereof, and at least two of the plurality of step difference portions being connected via at least one step portion, in other words, at least two step difference portions connected via at least one step portion.

It is needless to say that this concept can be also applied to the flexural mode, tuning fork, quartz crystal resonators shown in FIGS. 1 and 5. An example is shown in FIG. 13.

Figure 13:
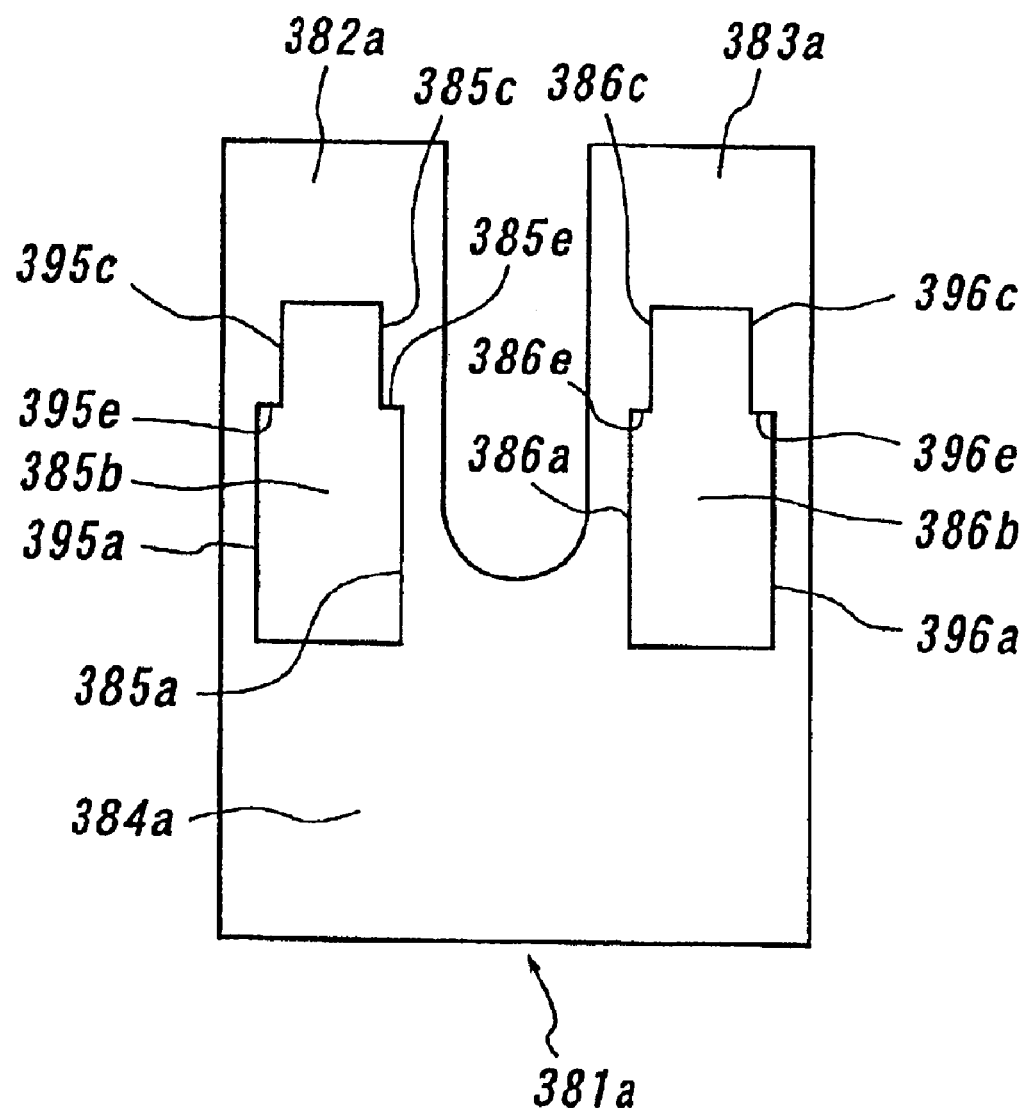
FIG. 13 is a plan view of a flexural mode quartz crystal resonator constructing a quartz crystal unit of the sixth embodiment of the present invention.

FIG. 13 shows a plan view of a flexural mode, tuning fork, quartz crystal resonator 381a which constructs a quartz crystal unit of the sixth embodiment of the present invention. The resonator 381a comprises tuning fork tines 382a, 383a and tuning fork base 384a. The tines 382a and 383a have grooves 385b and 386b on the obverse faces thereof in FIG. 13, and the grooves 385b and 386b comprise step difference portions 385a, 385c, 395a, 395c and 386a, 386c, 396a, 396c along the direction of length thereof, respectively. In addition, the step difference portions 385a and 385c, and 395a and 395c are connected via step portions 385e and 395e, respectively. Similar to this, the step difference portions 386a and 386c, and 396a and 396c are connected via step portions 386e and 396e, respectively. In this embodiment, the grooves 385b and 386b extend into the base 384a. Electrodes for this resonator are not disposed in FIG. 13, but they are disposed on the step difference portions and sides of the tuning fork tines similar to that of FIG. 3.

Thus, by constructing the electrodes and the step portions, a tuning fork, quartz crystal resonator capable of vibrating in fundamental mode very easily can be obtained with a small series resistance $R_1$ and a high quality factor Q because the quantity of charges which generate on the step difference portions and the sides of the tuning fork tines can be controlled and the second and third overtone modes for the resonator which are unwanted vibration modes can be substantially suppressed in vibration. In this embodiment, the grooves are constructed at the obverse faces of the tines, but though it is not visible in FIG. 13, grooves and electrodes are constructed at the reverse faces of the tines similar to that shown in FIG. 3.

Next, a method of manufacturing a quartz crystal unit of the present invention is described in detail, according to the manufacturing steps.

Figure 14:
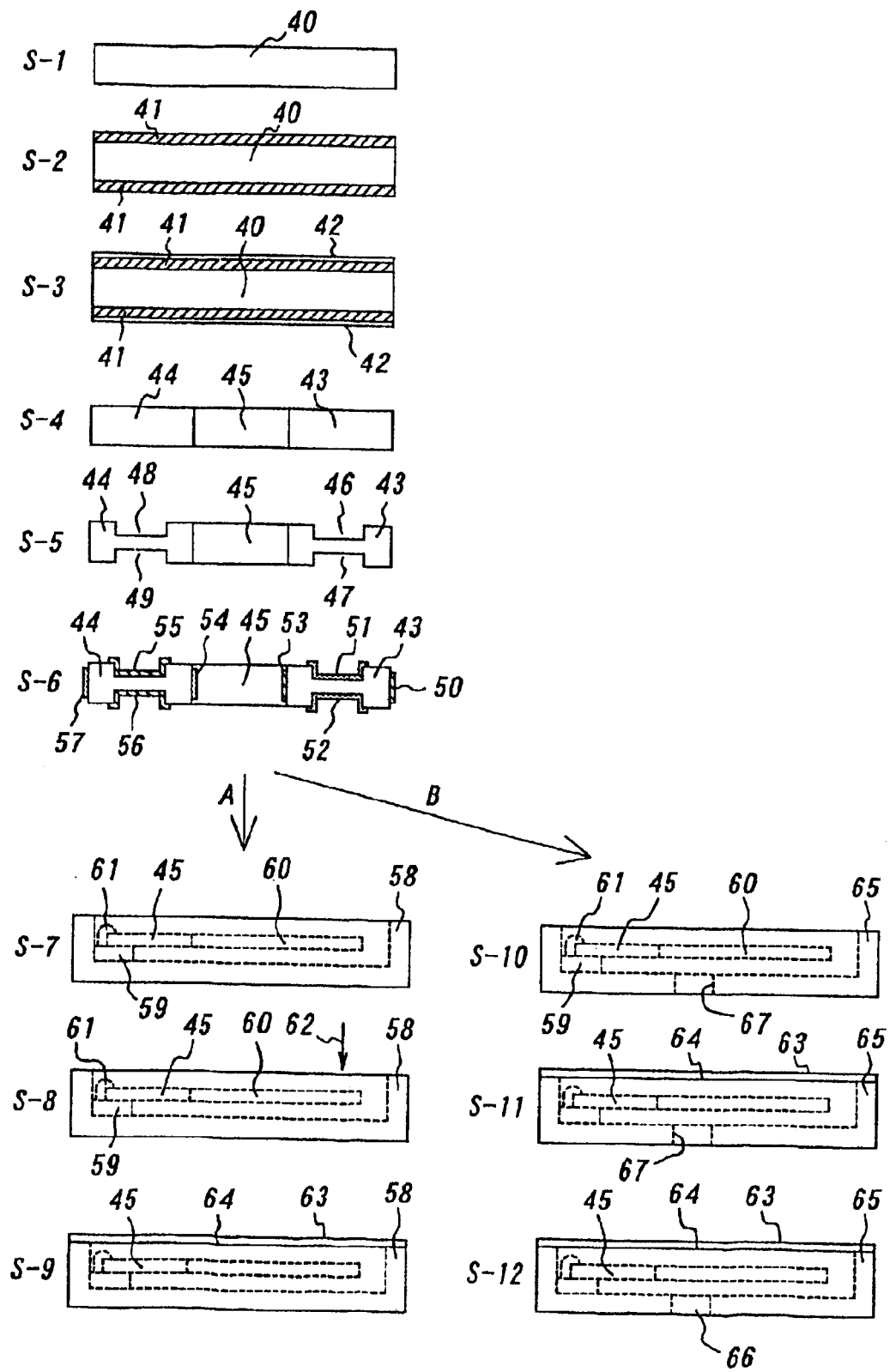
FIG. 14 shows a step diagram of a method for manufacturing a quartz crystal unit of the present invention.
Figure 15A:
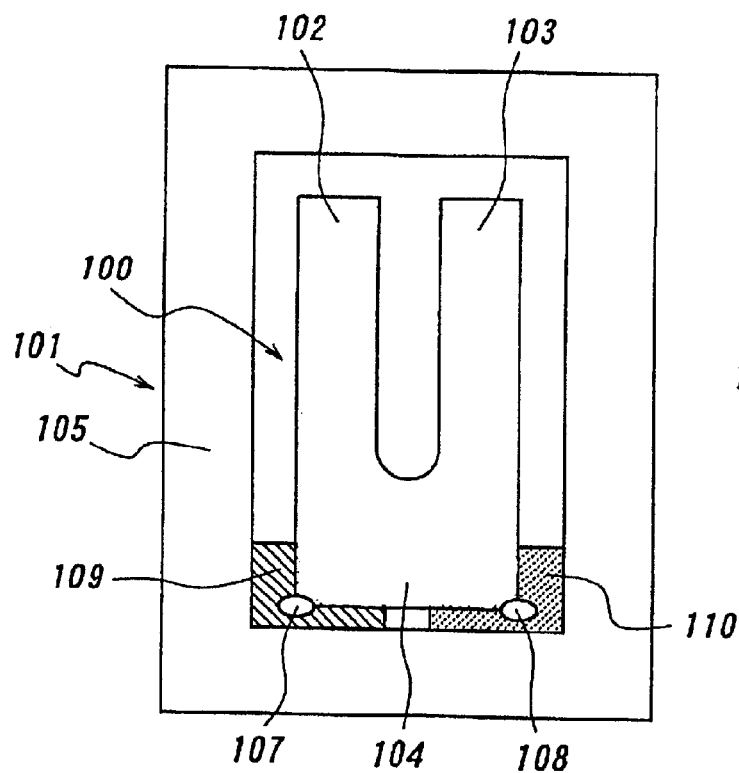
FIG. 15(a) and FIG. 15(b) are a plan view and a side view of the conventional quartz crystal unit.
Figure 15B:
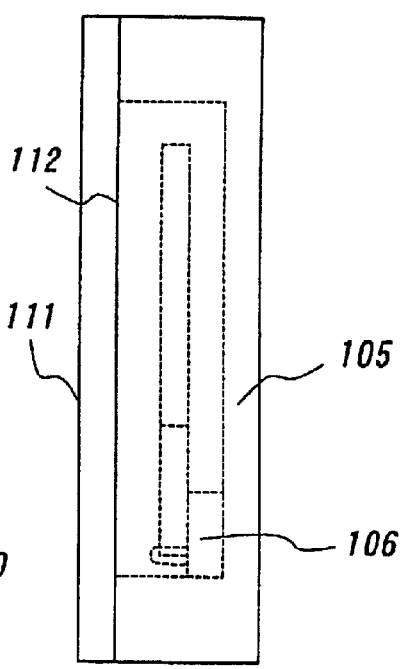
Figure 16:
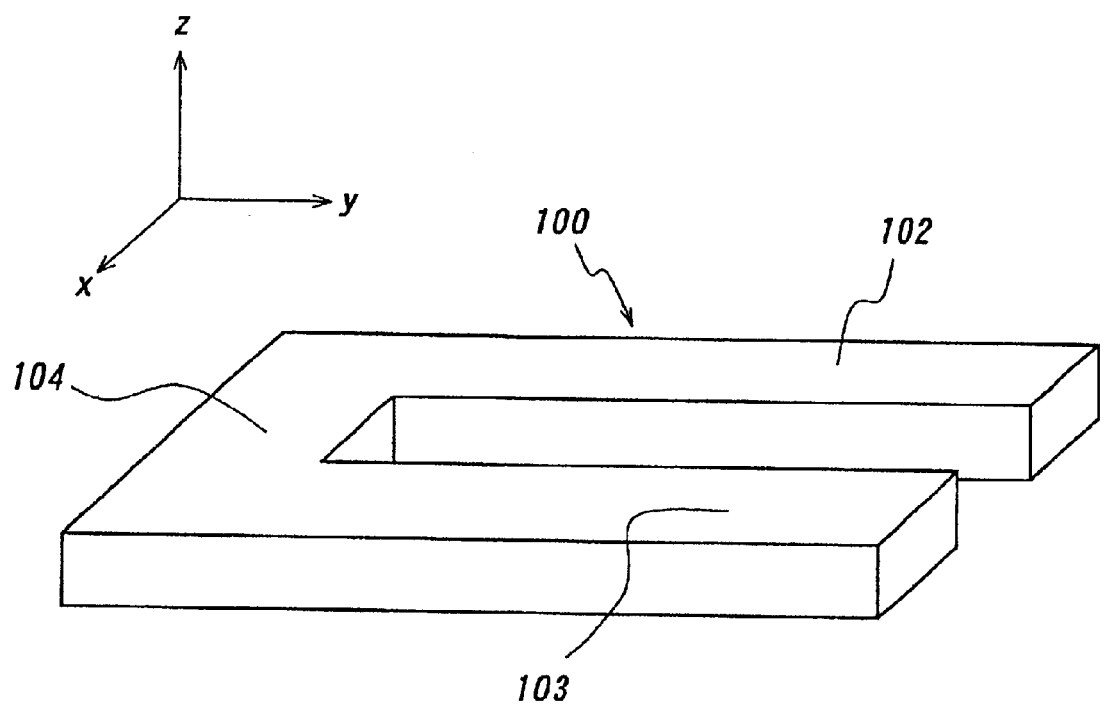
FIG. 16 is a general view of the conventional flexural mode, tuning fork, quartz crystal resonator constructing the quartz crystal unit of the prior art.
Figure 17:
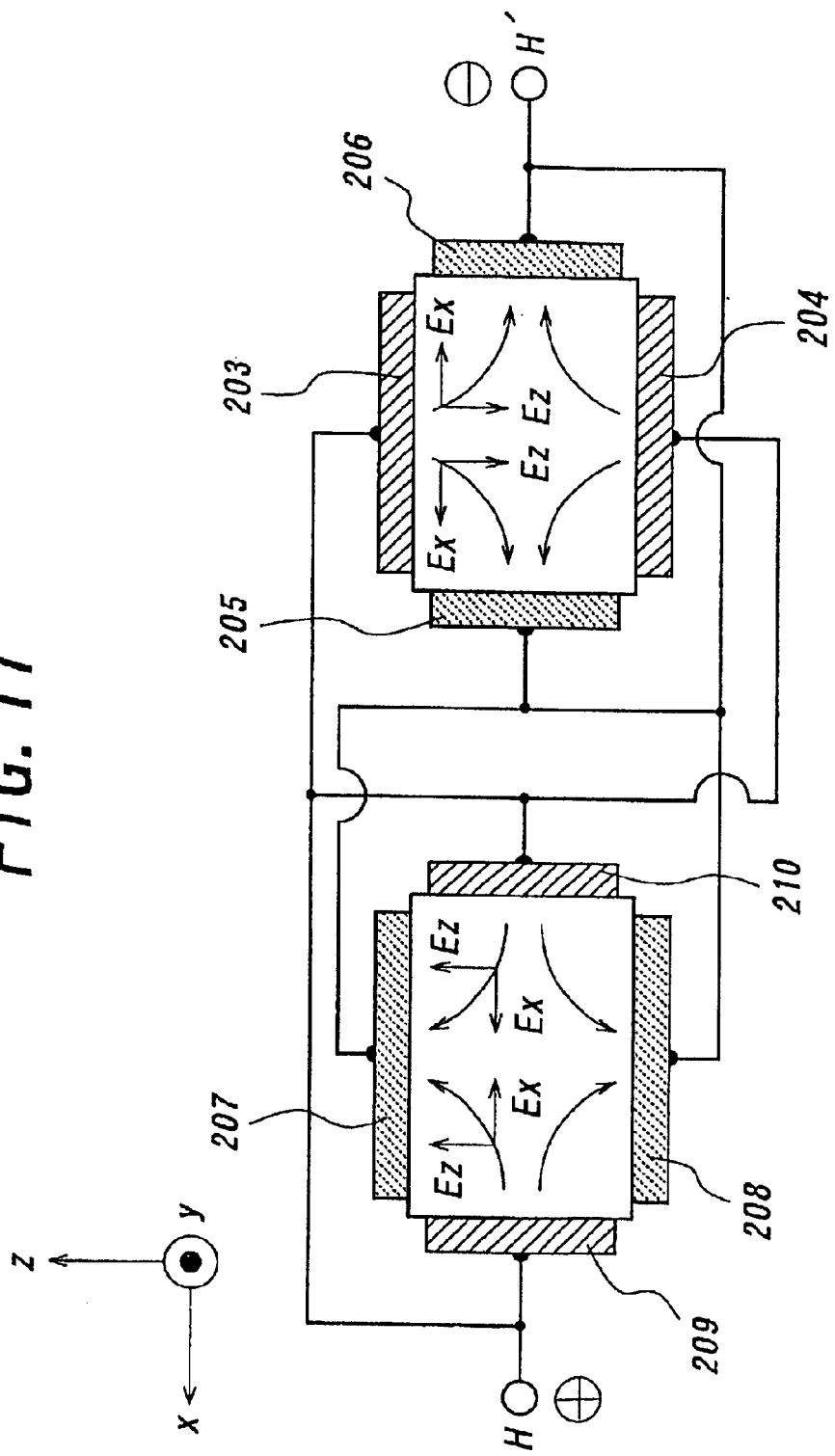
FIG. 17 is a cross-sectional view of the tuning fork tines of FIG. 16, and illustrating electrode construction.

FIG. 14 shows an embodiment of a method for manufacturing a quartz crystal unit of the present invention and a step diagram embodying the present invention. The signs of S-1 to S-12 are the step numbers. First, S-1 shows a cross-sectional view of a quartz crystal wafer 40. Next, in S-2 metal film 41, for example, chromium and gold on the chromium are, respectively, disposed on upper and lower faces of the quartz crystal wafer 40 by an evaporation method or a spattering method. In addition, resist 42 is spread on said metal film 41 in S-3, and after the metal film 41 and the resist 42 were removed except those of tuning fork shape by a photolithographic process and an etching process, the tuning fork shape with tuning fork tines 43, 44 and a tuning base 45, as be shown in S-4, is integrally formed by a chemical etching process. In FIG. 14 the formation of a piece of tuning fork shape is shown, but, a number of tuning fork shapes are actually formed in a piece of quartz crystal wafer.

Similar to the steps of S-2 and S-3, metal film and resist are spread again on the tuning fork shape of S-4 and grooves 46, 47, 48 and 49 each of which has two step difference portions along the length direction of the tuning fork tines, are formed at the tuning fork tines 43, 44 by the photolithographic process and the etching process, and the shape of S-5 is obtained after all of the resist and the metal film were removed. In addition, metal film and resist are spread again on the shape of S-5 and electrodes which are of opposite electrical polarity, are disposed on sides of the tuning fork tines and inside the grooves thereof, as be shown in S-6.

Namely, electrodes 50, 53 disposed on the sides of the tuning fork tine 43 and electrodes 55, 56 disposed inside the grooves 48, 49 of the tuning fork tine 44 have the same electrical polarity. Similarly, electrodes 51, 52 disposed inside the grooves 46, 47 of the tuning fork tine 43 and electrodes 54, 57 disposed on the sides of the tuning fork tine 44 have the same electrical polarity. Two electrode terminals are, therefore, constructed. In more detail, when an alternating current (AC) voltage is applied between the terminals, the tuning fork tines are capable of vibrating in flexural mode in inverse phase because said electrodes disposed on step difference portions of the grooves and the electrodes disposed opposite to the said electrodes have opposite electrical polarity. In the step of S-6, a piece of tuning fork quartz crystal resonator capable of vibrating in flexural mode is shown in the quartz crystal wafer, but a number of tuning fork quartz crystal resonators are actually formed in the quartz crystal wafer.

In addition, resonance frequency for said resonators is adjusted by a separate step of at least twice and the first adjustment of resonance frequency for said resonators is performed in the quartz crystal wafer by laser or evaporation or plasma etching method so that a frequency deviation of said resonators is within a range of −9000 PPM to +5000 PPM(Parts Per Million). The adjustment of frequency by laser or plasma etching method is performed by trimming mass disposed on tuning fork tines and the adjustment of frequency by an evaporation method is performed by adding mass on tuning fork tines. Namely, those methods can change the resonance frequency of said resonators. Also, the resonators formed in the quartz crystal wafer are inspected therein and when there are failure resonators, something are marked on them in the quartz crystal wafer or they are removed from the quartz crystal wafer.

In this embodiment, the tuning fork shape is formed from the step of S-3 and after that, the grooves are formed at the tuning fork tines, namely, the tuning fork tines are formed before the grooves are formed, but this invention is not limited to said embodiment, for example, the grooves are first formed from the step of S-3 and after that, the tuning fork shape may be formed, namely, the grooves are formed before the tuning fork tines are formed. Also, the tuning fork shape and the grooves may be formed simultaneously, namely, the tuning fork tines and the grooves are formed simultaneously. In addition, the grooves each of which has two step difference portions along the direction of length of the tuning fork tines, are formed in this embodiment, but, each of the grooves may have step difference portions more than two, at least two of which are connected via at least one step portion.

There are two methods of A and B in the following step, as be shown by arrow signs. For the step of A, the tuning fork base 45 of the formed flexural mode, tuning fork, quartz crystal resonator 60 is first mounted on mounting portion 59 of case 58 by conductive adhesives 61 or solder, as be shown in S-7. Next, the second adjustment of resonance frequency for the resonator 60 is performed by laser 62 or evaporation or plasma etching method in S-8 so that a frequency deviation is within a range of −100 PPM to +100 PPM. Finally, the case 58 and lid 63 are connected via glass 64 with the low melting point or a metal in S-9. In this case, the connection of the case and the lid is performed in vacuum because the case 58 has no hole to close it in vacuum.

In addition, though it is not visible in FIG. 14, the third frequency adjustment may be performed by laser after the step of the connection of S-9 to get a small frequency deviation when a material of the lid is glass. As a result of which it is possible to get the resonator with the frequency deviation which is within a range of −50 PPM to +50 PPM. A nominal frequency is generally less than 200 kHz, especially, 32.768 kHz is widely used in communication equipment as a time standard.

For the step of B, the tuning fork base 45 of the formed resonator 60 is first mounted on mounting portion 59 of case 65 by conductive adhesives 61 or solder in S-10, in addition, in S-11 the case 65 and lid 63 are connected by the same way as that of S-9, in detail, after the resonator was mounted on the mounting portion of the case or after the case and the lid were connected, the second adjustment of resonance frequency is performed so that a frequency deviation is generally within a range of −100 PPM to +100 PPM in vacuum, but, it may be within a wider range, for example, −950 PPM to +100 PPM when the third frequency adjustment as will be shown as follows, is performed. Finally, a hole 67 constructed at the case 65 is closed in vacuum using such a metal 66 as solder or glass with the low melting point in S-12.

Also, similar to the step of A, the third adjustment of resonance frequency may be performed by laser after the step of S-12 to get a small frequency deviation. As a result of which it is possible to get the resonator with the frequency deviation which is within a range of −50 PPM to +50 PPM. Thus, a frequency deviation of the resonators in the case of A and B is finally within a range of −100 PPM to +100 PPM at most. Also, the second frequency adjustment may be performed after the case and the lid were connected and the hole was closed in vacuum. In addition, the hole is constructed at the case, but may be constructed at the lid. Also, the frequency adjustment of the present invention is performed in vacuum or inert gas such as nitrogen gas or atmosphere, and the values described above are values in vacuum.

Therefore, the quartz crystal units of the present invention manufactured by the above-described method are miniaturized and realized with a small series resistance $R_1$, a high quality factor Q and low price.

In addition, an insulation material such as $SiO_2$ may be constructed on obverse and reverse faces of the width WI and the width $W_3$ of the tuning fork tines to prevent a short circuit of between the electrodes of the sides and the grooves thereof, and the insulation material is formed by a spattering method or an evaporation method. Also, when a tuning fork shape comprising tuning fork tines and a tuning fork base is formed by a photo-lithographic process and an etching process, cut portions may be also formed simultaneously at the tuning fork base.

Likewise, in the present embodiments a flexural mode quartz crystal resonator of tuning fork type has two tuning fork tines, but embodiments of the present invention include tuning fork tines more than two. In addition, the tuning fork quartz crystal resonators of the present embodiments are housed in a package of surface mounting type comprising a case and a lid, but may be housed in a package of tubular type.

The above-described resonators are formed by at least one method of chemical, mechanical and physical etching methods. For example, the physical etching method is a method by ion etching.

Also, though the grooves are constructed at the tuning fork tines and the tuning fork base in the embodiments, the present invention is not limited to this, but also, includes through holes($t_1$=0). In this case, the grooves may be replaced with the through holes.

As described above, it will be easily understood that the quartz crystal units with the flexural mode, tuning fork, quartz crystal resonator with novel shapes and the novel electrode construction according to the present invention may have the outstanding effects. In addition to this, while the present invention has been shown and described with reference to preferred embodiments thereof, it will be understood by those skilled in the art that the changes in shape and electrode construction can be made therein without departing from the spirit and scope of the present invention.

What is claimed is:

1. A quartz crystal unit comprising: a quartz crystal tuning fork resonator capable of vibrating in a flexural mode, the quartz crystal tuning fork resonator having a tuning fork base, a plurality of tuning fork tines connected to the tuning fork base, a groove having a stepped portion formed in at least one of opposite main surfaces of each of the tuning fork tines, a plurality of first electrodes each disposed on the stepped portion of the groove of a respective one of the tuning fork tines, and a plurality of second electrodes each disposed on at least one side surface of a respective one of the tuning fork tines, the second electrodes having an electrical polarity opposite to an electrical polarity of the first electrodes; a case for housing the quartz crystal tuning fork resonator; and a lid for covering an open end of the case; wherein a width $W_2$ of the groove in each of the tuning fork tines is within a range of 0.03 mm to 0.12 mm, and a ratio ($W_2/W$) is greater than 0.35 and less than 1, where W represents a width of each of the tuning fork tines.

2. A quartz crystal unit according to claim 1; wherein a merit value $M_1$ in a fundamental mode of vibration of the Quartz crystal tuning fork resonator is greater than 65 so that a high frequency stability is obtained for a fundamental mode of vibration of the quartz crystal tuning fork resonator, where the merit value $M_1$ is defined by a ratio ($O_1/r_1$) where $O_1$ and $r_1$ represent a quality factor and a capacitance ratio, respectively, of the quartz crystal tuning fork resonator capable of vibrating in the fundamental mode of vibration.

3. A quartz crystal unit according to claim 1; wherein a thickness t of each of the tuning fork tines is within a range of 0.05 mm to 0.15 mm; and wherein a ratio ($t_1/t$) is less than 0.79, where $t_1$ represents a thickness of a base portion of the groove formed in each of the tuning fork tines.

4. A quartz crystal unit according to claim 3; wherein an area S of the groove formed in each of the tuning fork tines is defined by $l_1 \times W_2$ and is within a range of 0.023 mm² to 0.098 mm², where $l_1$ represents a length of the groove formed in each of the tuning fork tines: and wherein a ratio ($l_1/l$) is within a range of 0.2 to 0.78, where l represents an overall length of each of the tuning fork tines.

5. A quartz crystal unit according to claim 3; wherein a series resistance $R_1$ for a fundamental mode of vibration of the quartz crystal tuning fork resonator is less than a series resistance $R_2$ for a second overtone mode of vibration of the quartz crystal tuning fork resonator.

6. A quartz crystal unit according claim 3; wherein when a thickness of each of the tuning fork tines is in the range of 0.06 mm to 0.15 mm, an area of the groove formed in each of the tuning fork tines is within a range of 0.023 mm² to 0.098 mm², and a distance between adjacent tuning fork tines is within a range of 0.05 mm to 0.35 mm.

7. A quartz crystal unit according to claim 3; wherein one of the case and the lid has a mounting portion; and wherein the tuning fork quartz crystal resonator is connected to the mounting portion by conductive adhesives or solder.

8. A quartz crystal unit according to claim 7, wherein a width $W_2$ of the groove formed in each of the tuning fork tines is greater than or equal to a distance $W_1$ extending between a first side of the groove and a first side of the tuning fork tine and greater than or equal to a distance $W_3$ extending between a second side of the groove opposite the first side thereof and a second side of the tuning fork tine Opposite the first side thereof; and wherein $W_1$ is greater than or equal to $W_3$.

9. A quartz crystal unit according to claim 7; wherein a width $W_2$ of the groove formed in each of the tuning fork tines is greater than or equal to a distance $W_1$ extending between a first side of the groove and a first side of the tuning fork tine and greater than or equal to a distance $W_3$ extending between a second side of the groove opposite the first side thereof and a second side of the tuning fork tine opposite the first side thereof; and wherein $W_1$ is less than $W_3$.

10. A quartz crystal unit according to claim 7; further comprising a surface mounting-type package for packaging the quartz crystal tuning fork resonator.

11. A quartz crystal unit according to claim 7; further comprising a tubular package for packaging the quartz crystal tuning fork resonator.

12. A quartz crystal unit according to claim 1; wherein a merit value $M_2$ in a second overtone mode of vibration of the quartz crystal tuning fork resonator is less than 30 so that the second overtone mode of vibration of the quartz crystal tuning fork resonator is suppressed, where the merit value $M_2$ is defined by a ratio ($O_2/r_2$) where $O_2$ and $r_2$ represent a quality factor and a capacitance ratio, respectively, of the outran crystal tuning fork resonator capable of vibrating in the second overtone mode.

13. A quartz crystal unit according to claim 1; wherein the stepped portions formed in the tuning fork tines comprise first and second stepped portions each formed along a longitudinal direction of a respective one of the two tuning fork tines; and further comprising a third stepped portion interconnecting the first and second stepped portions.

14. A quartz crystal unit according to claim 3; wherein the thickness $t_1$ of the base of the groove formed in each of the tuning fork tines is zero to define a through-hole extending between the opposite main surfaces of each of the tuning fork tines.

15. A quartz crystal unit comprising: a quartz crystal tuning fork resonator capable of vibrating in a flexural mode, the quartz crystal tuning fork resonator having a tuning fork base, a pair of tuning fork tines connected to the tuning fork base, a plurality of grooves each formed on opposite main surfaces of each of the tuning fork tines, and a plurality of electrodes each disposed in a respective one of the grooves; a case for housing the quartz crystal tuning fork resonator; and a lid for covering an open end of the case; wherein a distance $W_4$ between the tuning fork tines is within a range of 0.05 to 0.35 mm and is greater than or equal to a width $W_2$ of at least one of the grooves formed in each of the fork tines.

16. A quartz crystal unit according to claim 15; wherein the width $W_2$ of at least one of the grooves formed in each of the tuning fork tines is within a range of 0.03 mm to 0.12 mm, and a ratio ($W_2/w$) is greater than 0.35 and less than 1, where W represents a width of each of the tuning fork tines.

17. A quartz crystal unit according to claim 16; wherein a thickness t of each of the tuning fork tines is in the range of 0.06 mm to 0.15 mm, and a ratio ($t_1/t$) is less than 0.79, where $t_1$ represents a thickness of a base of at least one of the grooves formed in each of the tuning fork tines.

18. A quartz crystal unit according to claim 16; wherein the plurality of electrodes comprise first electrodes; and further comprising a plurality of second electrodes each disposed on respective side surfaces of each of the tuning fork tines; and wherein for each of the tuning fork tines, the second electrodes have an electrical polarity opposite to an electrical polarity of the first electrodes.

19. A quartz crystal unit according to claim 16; wherein a merit value $M_2$ in a second overtone mode of vibration of the quartz crystal tuning fork resonator is less than 30 so that the second overtone mode of vibration of the quartz crystal tuning fork resonator is suppressed, where the merit value $M_2$ is defined by a ratio ($Q_2/r_2$) where $Q_2$ and $r_2$ represent a quality factor and a capacitance ratio, respectively, of the quartz crystal tuning fork resonator capable of vibrating in the second overtone mode.

20. A quartz crystal unit according to claim 19; wherein the pair of tuning fork tines comprises a first tuning fork tine and a second tuning fork tine, and the plurality of electrodes comprise first electrodes; and wherein the quartz crystal tuning fork resonator has a first electrode terminal and a second electrode terminal, the first electrode terminal comprising the first electrodes disposed in the grooves of the first tuning fork tine and second electrodes connected to the first electrodes and disposed on opposite side surfaces of the second tuning fork tine, the second electrode terminal comprising the first electrodes disposed in the grooves of the second tuning fork tine and second electrodes connected to the first electrodes and disposed on opposite side surfaces of the first tuning fork tine.

21. A quartz crystal oscillator comprising:

a quartz crystal unit having a quartz crystal tuning fork resonator capable of vibrating in a flexural mode and a CMOS inverter and a plurality of capacitors and resistors connected to the quartz crystal tuning fork resonator, the quartz crystal tuning fork resonator having a tuning fork base, a plurality of tuning fork tines connected to the tuning fork base, a plurality of grooves each formed on opposite main surfaces of each of the tuning fork tines, and a plurality of electrodes each disposed in a respective one of the grooves; wherein a width $W_2$ of at least one of the grooves formed in each of the tuning fork tines is within a range of 0.03 mm to 0.12 mm, and a ratio ($W_2/w$) is greater than 0.35 and less than 1, where W represents a width of each of the tuning forks.

22. A quartz crystal oscillator according to claim 21; wherein a distance $W_4$ between the tuning fork tines is within a range of 0.05 mm to 0.35 mm and is greater than or equal to the width $W_2$ of at least one of the grooves formed in each of the tuning fork tines.

23. A quartz crystal oscillator according to claim 22; wherein a merit value $M_2$ in a second overtone mode of vibration of the quartz crystal tuning fork resonator is less than 30 so that the second overtone mode of vibration of the quartz crystal tuning fork resonator is suppressed, where the merit value $M_2$ is defined by a ratio ($Q_2/r_2$) where $Q_2$ and $r_2$ represent a quality factor and a capacitance ratio, respectively, of the quartz crystal tuning fork resonator capable of vibrating in the second overtone mode.

24. A quartz crystal oscillator according to claim 23; wherein the plurality of tuning fork tines comprises a first tuning fork tine and a second tuning fork tine, and the plurality of electrodes comprise first electrodes; and wherein the quartz crystal tuning fork resonator has a first electrode terminal and a second electrode terminal, the first electrode terminal comprising the first electrodes disposed in the grooves of the first tuning fork tine and second electrodes connected to the first electrodes and disposed on opposite side surfaces of the second tuning fork tine, the second electrode terminal comprising the first electrodes disposed in the grooves of the second tuning fork tine and second electrodes connected to the first electrodes and disposed on opposite side surfaces of the first tuning fork tine.

* * * * *